(12) United States Patent
Tomabechi et al.

(10) Patent No.: US 7,598,106 B2
(45) Date of Patent: Oct. 6, 2009

(54) OPTICAL SEMICONDUCTOR DEVICE AND FABRICATION METHOD THEREFOR

(75) Inventors: Shuichi Tomabechi, Kawasaki (JP); Tsuyoshi Yamamoto, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 388 days.

(21) Appl. No.: 11/111,995

(22) Filed: Apr. 22, 2005

(65) Prior Publication Data

US 2006/0145276 A1   Jul. 6, 2006

(30) Foreign Application Priority Data

Jan. 5, 2005   (JP) .............................. 2005-000905

(51) Int. Cl.
*H01L 31/00* (2006.01)
*H01L 21/00* (2006.01)

(52) U.S. Cl. .................... 438/47; 257/13; 257/E33.003

(58) Field of Classification Search ............ 438/16, 438/27, 65, 32, 35, 31, 57, 39, 46, 431, 432, 438/22, 83; 257/E33.006, E33.007, 431, 257/466, 86, 98, 432, 79–90, 190, E33.003, 257/E33.028, 446; 372/49.01, 46.01, 45.01, 372/43.01

See application file for complete search history.

(56) References Cited

U.S. PATENT DOCUMENTS

| | | | | |
|---|---|---|---|---|
| 4,661,960 A * | 4/1987 | Hirayama et al. | ......... | 372/45.01 |
| 4,758,535 A * | 7/1988 | Sakakibara et al. | ............ | 438/43 |
| 5,079,185 A * | 1/1992 | Kagawa et al. | ................ | 438/32 |
| 5,280,493 A * | 1/1994 | Takiguchi et al. | ......... | 372/45.01 |
| 5,291,033 A * | 3/1994 | Morishima | .................... | 257/13 |
| 5,379,314 A * | 1/1995 | Nemoto et al. | ........... | 372/46.01 |
| 5,418,374 A * | 5/1995 | Morita et al. | ................. | 257/13 |
| 5,438,583 A * | 8/1995 | Narui et al. | .............. | 372/45.01 |
| 5,452,315 A * | 9/1995 | Kimura et al. | ........... | 372/46.01 |
| 5,783,844 A * | 7/1998 | Kobayashi et al. | .......... | 257/103 |
| 6,055,255 A * | 4/2000 | Suyama et al. | ........... | 372/46.01 |
| 6,130,108 A * | 10/2000 | Uchida | ........................ | 438/46 |
| 6,320,209 B1 * | 11/2001 | Hata et al. | ................... | 257/190 |
| 2002/0094598 A1 * | 7/2002 | Kobayashi et al. | ............ | 438/57 |
| 2003/0087467 A1 * | 5/2003 | Oohata et al. | ................. | 438/47 |
| 2003/0129779 A1 * | 7/2003 | Akiyama | ..................... | 438/39 |
| 2003/0141508 A1 * | 7/2003 | Okuyama et al. | ............. | 257/79 |

FOREIGN PATENT DOCUMENTS

JP   10-41587   2/1998
JP   2003-204121   7/2003

* cited by examiner

*Primary Examiner*—W. David Coleman
*Assistant Examiner*—Latanya Crawford
(74) *Attorney, Agent, or Firm*—Kratz, Quintos & Hanson, LLP

(57) ABSTRACT

An optical semiconductor device such as, for example, a quantum dot SOA and a fabrication method therefor are disclosed wherein an active layer and a current constriction structure can be formed leftwardly and rightwardly symmetrically to minimize the polarization dependency. The fabrication method for an optical semiconductor device includes the steps of forming a semiconductor layer on a semiconductor substrate, forming a groove by removing the semiconductor layer at an opening of a mask, forming a first clad layer in the form of a projection having two symmetrical inclined faces in the groove by selective growth by using the mask as a selective growth mask, forming an active layer on the two inclined faces of the first clad layer, and removing the mask and burying the active layer with a second clad layer.

16 Claims, 4 Drawing Sheets

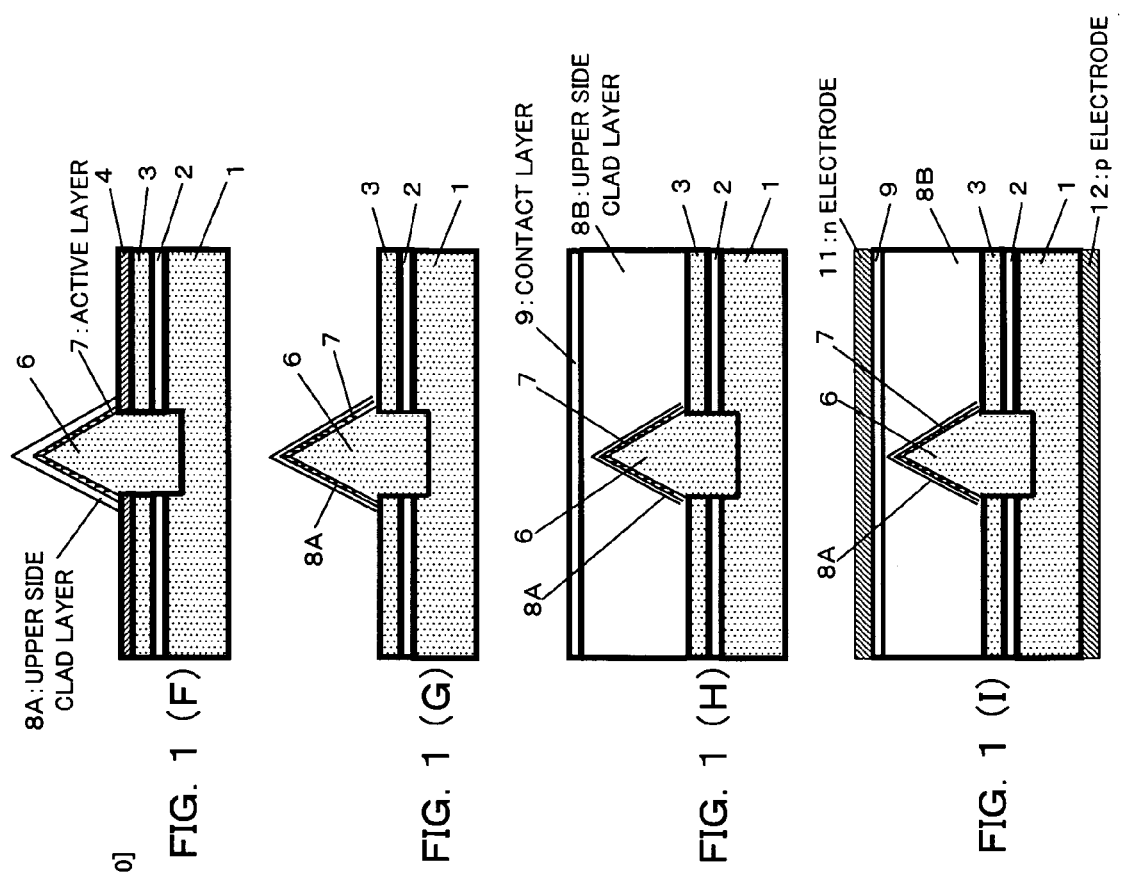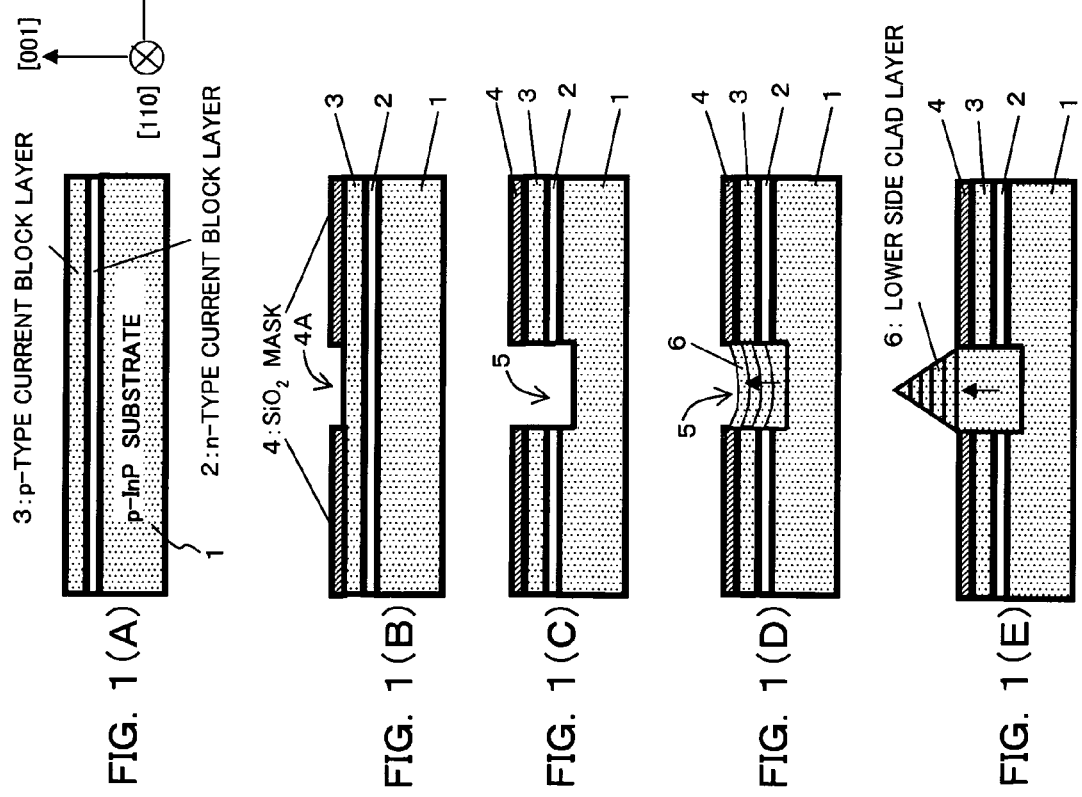

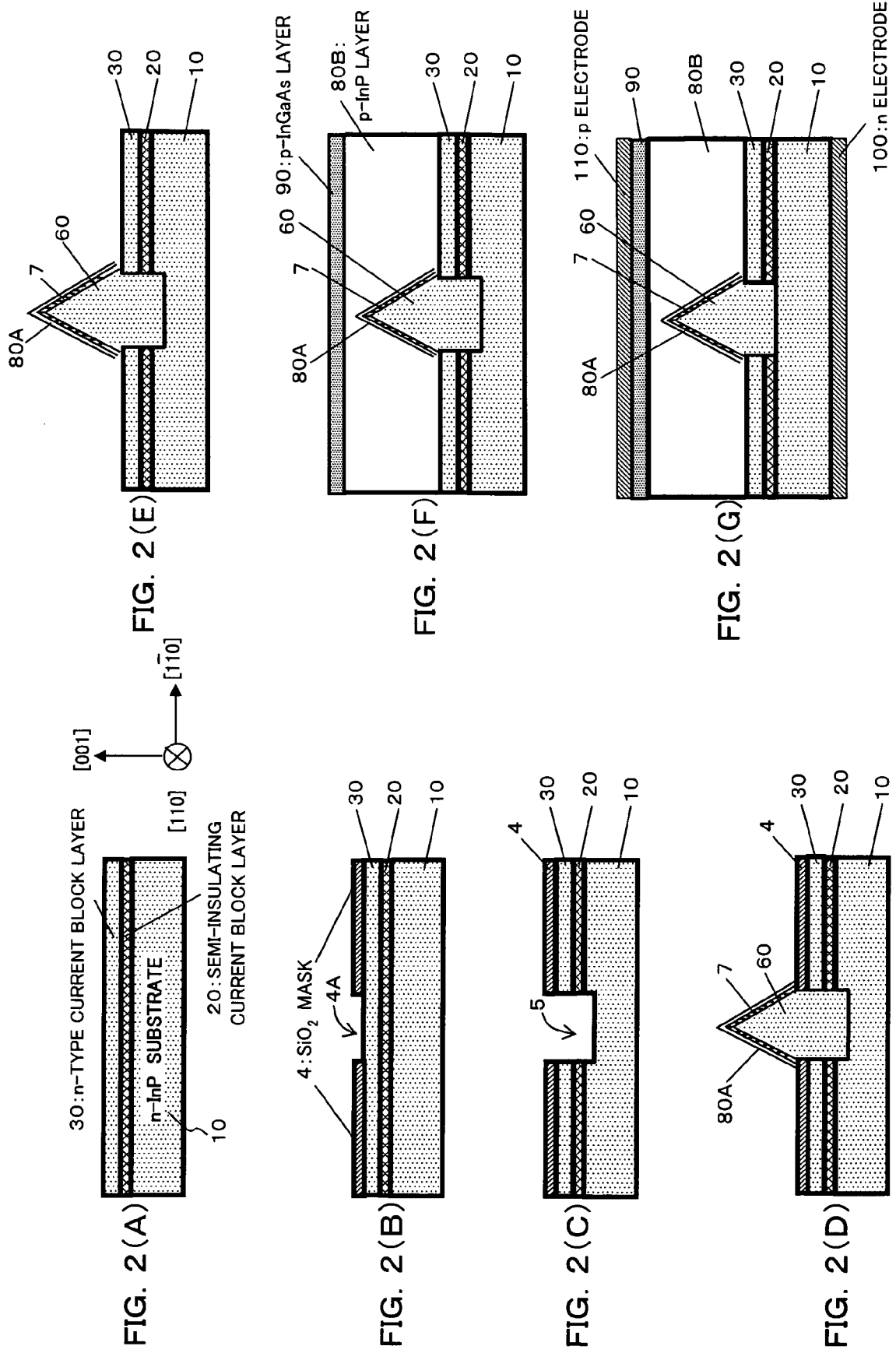

OPTICAL SEMICONDUCTOR DEVICE AND FABRICATION METHOD THEREFOR

CROSS REFERENCE TO RELATED APPLICATIONS

This application is based on and hereby claims priority to Japanese Patent Application No. 2005-000905 filed on 5 Jan. 2005 in Japan, the contents of which are hereby incorporated by reference

BACKGROUND OF THE INVENTION (1) Field of the Invention

This invention relates to an optical semiconductor device for use with optical communication and a fabrication method therefor, and more particularly to an optical semiconductor device suitable for use, for example, with a semiconductor optical amplifier wherein quantum dots are used for an active layer and a fabrication method for the optical semiconductor device.

(2) Description of the Related Art

In recent years, an optical semiconductor amplifier (hereinafter referred to as quantum dot SOA) having an active layer formed from quantum dots has a broad gain bandwidth and is expected promising as a device which can amplify CWDM (Coarse Wavelength Division Multiplexing) signals.

In order to place a quantum dot SOA into practical use, it is demanded not only to expand the gain bandwidth but also to reduce the polarization dependency and finally achieve polarization independent.

For example, if an active layer is formed on a face parallel to a substrate in a quantum dot SOA, then since the dots have a flattened shape, the gain with regard to TE polarized light is high and a high polarization dependency is exhibited.

Therefore, as a structure for reducing the polarization dependency, an optical semiconductor device wherein quantum dots are formed, for example, on an inclined surface has been proposed (refer to, for example, Japanese Patent Laid-Open No. 2003-204121).

Meanwhile, a semiconductor laser formed taking the polarization dependency into consideration is disclosed, for example, in Japanese Patent Laid-Open No. Hei 10-41587.

SUMMARY OF THE INVENTION

In the following, an example of a fabrication method for an optical semiconductor device (optical semiconductor element) having an active layer formed from quantum dots on an inclined face is described with reference to FIGS. 3(A) to 3(F).

First, a dielectric mask (for example, a $SiO_2$ mask) 51 having an opening is formed on an n-InP substrate 50 as shown in FIG. 3(A). Then, a lower side cladding layer 52 made of n-InP is grown on the n-InP substrate 50 by a metal organic-chemical phase vapor deposition growth method using the dielectric mask 51 as a selective growth mask as seen in FIG. 3(B). In this instance, the lower side cladding layer 52 has a ridge structure of a triangular cross section at the opening and has two symmetrical inclined faces.

Thereafter, the dielectric mask 51 is removed as seen in FIG. 3(C), and then an active layer 53 is grown on the overall area of the n-InP substrate 50 and the lower side cladding layer 52 as seen in FIG. 3(D). Then, p-InP layers 54 and 55 serving as an upper side cladding layer are formed on the active layer 53 as seen in FIGS. 3(D) and 3(E).

Finally, a mesa-shape forming mask (for example, a dielectric mask) having a striped opening of a width of approximately 1.5 μm is formed as shown in FIG. 3(F), and etching (by wet etching or dry etching) is performed using the mesa-shape forming mask, thereby the shape of a mesa is formed. Thereafter, a p electrode 56 and an n electrode 57 are formed at the top and the bottom, respectively.

An SOA fabricated in this manner and having the active layer 53 formed from quantum dots on inclined faces substantially perpendicular to each other has an extremely reduced polarization dependency because the gains with regard to TE polarized light and TM polarized light are leftwardly and rightwardly symmetrical to each other.

However, such a quantum dot SOA as shown in FIG. 3(F) exhibits high operating current because it is an optical semiconductor device of the ridge type.

Further, where the conventional mesa-shape forming technique is applied to a quantum dot SOA having a mesa shape of a width of approximately 1 to 2 μm, it is difficult to perform positioning with a high degree of accuracy of a mesa-shape forming mask (for example, a striped dielectric mask) which is used upon exposure at an etching step. Therefore, it is very difficult to form an active layer, which is formed from quantum dots on the two inclined faces of the lower side cladding layer 52 included in the mesa shape, leftwardly and rightwardly symmetrically (leftwardly and rightwardly symmetrically with respect to a vertical line passing the apex of the lower side cladding layer formed so as to have a substantially triangular sectional shape). If the active layer formed from quantum dots is not formed leftwardly and rightwardly symmetrically, then it is difficult to achieve the polarization independent.

It is to be noted that, in order to reduce the operating current, it is effective to provide a current constriction (blocking) structure around the active layer. Therefore, it is a possible idea to provide, after the mesa shape is formed in such a manner as described above, for example, a current constriction structure formed from a p-InP current block layer 58, an n-InP current block layer 59 and a p-InP layer 55A, which serves as an upper side cladding layer, stacked in order on the opposite sides of the mesa structure as seen in FIG. 4. Also in this instance, it is difficult to perform positioning of a mesa-shape forming mask with a high degree of accuracy, and it is very difficult to form an active layer formed from quantum dots leftwardly and rightwardly symmetrically. Therefore, it is difficult to achieve the polarization independent.

It is an object of the present invention to provide an optical semiconductor device and a fabrication method therefor wherein an active layer and a current constriction structure can be formed leftwardly and rightwardly symmetrically to achieve the polarization independent (non-dependency).

In order to attain the object described above, according to an aspect of the present invention, there is provided a fabrication method for an optical semiconductor device, comprising the steps of forming a semiconductor layer on a semiconductor substrate, forming a groove by removing the semiconductor layer at an opening of a mask, forming a first cladding layer in the form of a projection having two symmetrical inclined faces in the groove by selective growth by using the mask as a selective growth mask, forming an active layer on the two inclined faces of the first cladding layer, and removing the mask and burying the active layer with a second cladding layer.

According to another aspect of the present invention, there is provided an optical semiconductor device, comprising a semiconductor substrate, a cladding layer in the form of a projection formed on the semiconductor substrate and having two symmetrical inclined faces, an active layer formed on the two inclined faces of the cladding layer, and a semiconductor layer formed in a contacting relationship with at least side faces of the cladding layer and having an equal thickness at portions in the proximity of contacting portions thereof with the cladding layer and any other portion thereof than the portions.

With the fabrication method for an optical semiconductor device and the optical semiconductor device, the active layer and a current constriction structure are formed leftwardly and rightwardly symmetrically, and consequently, there is an advantage that the polarization dependency is lowered and finally the polarization independent (non-dependency) can be achieved. If the present invention is applied, for example, to a quantum dot SOA, then such advantages can be achieved that the gain bandwidth can be expanded, that the operating current can be reduced, that the polarization dependency is reduced and that the polarization non-dependency can be implemented and besides that the yield can be enhanced.

The above and other objects, features and advantages of the present invention will become apparent from the following description and the appended claims, taken in conjunction with the accompanying drawings.

BRIEF DESCRIPTION OF THE DRAWINGS

FIGS. 1(A) to 1(I) are schematic sectional views illustrating a fabrication method for an optical semiconductor device according to a first embodiment of the present invention and showing a configuration of the optical semiconductor device;

FIGS. 2(A) to 2(G) are schematic sectional views illustrating a fabrication method for an optical semiconductor device according to a second embodiment of the present invention and showing a configuration of the optical semiconductor device;

DESCRIPTION OF THE PREFERRED EMBODIMENTS

Figure 3A:
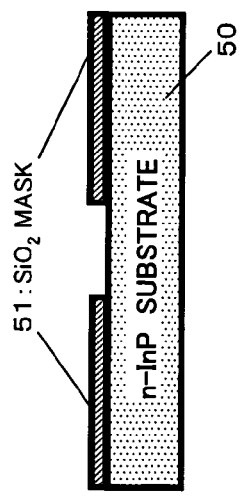
FIGS. 3(A) to 3(F) are schematic sectional views showing a conventional fabrication method for an optical semiconductor device and showing a configuration of the optical semiconductor device.
Figure 3B:
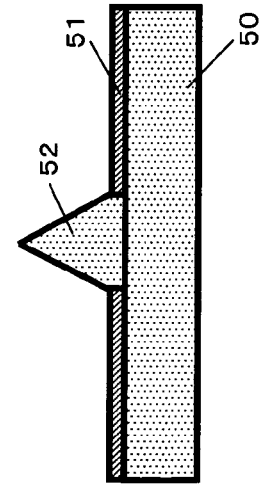
Figure 3C:
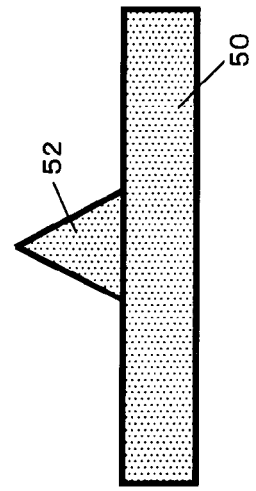
Figure 3D:
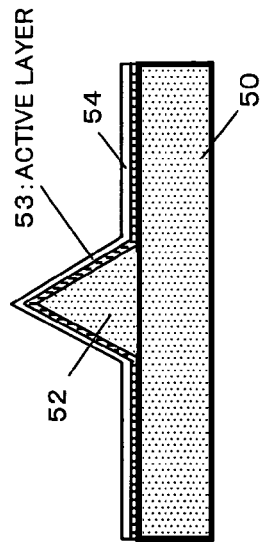
Figure 3E:
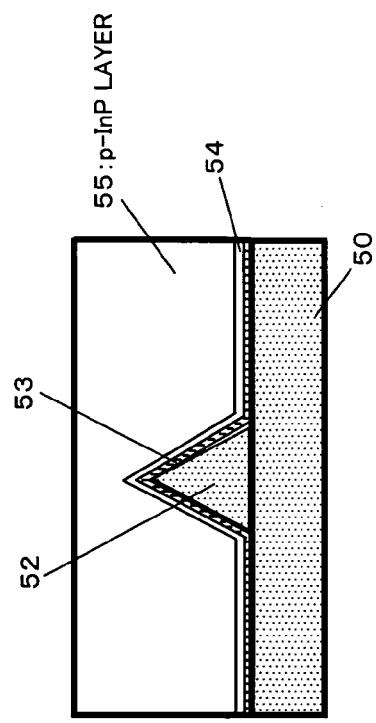
Figure 3F:
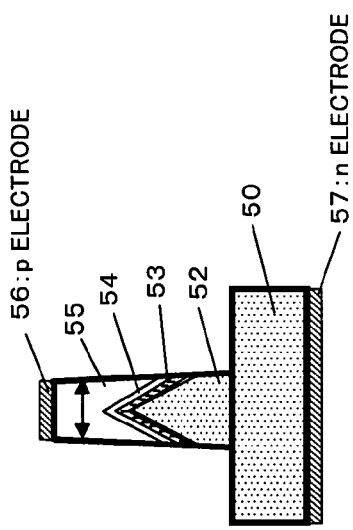
Figure 4:
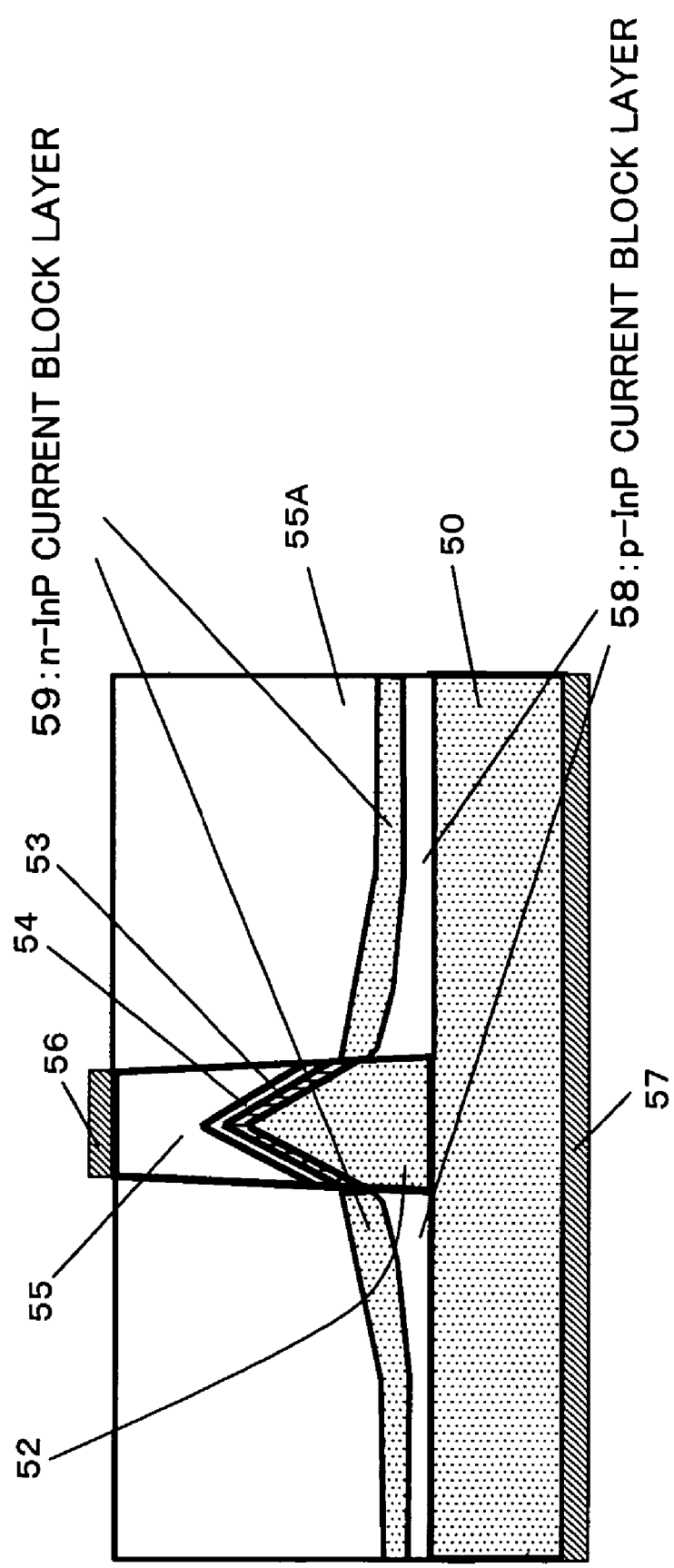
FIG. 4 is a schematic sectional view showing a configuration of another conventional optical semiconductor device.

In the following, optical semiconductor devices and fabrication methods therefor according to different embodiments of the present invention are described with reference to the drawings.

First Embodiment

An optical semiconductor device and a fabrication method therefor according to a first embodiment of the present invention are described with reference to FIGS. 1(A) to 1(I). It is to be noted that, for example, a metal organic vapor phase epitaxy (MOVPE) method is used for the crystal growth.

First, the fabrication method for an optical semiconductor device according to the present embodiment is described taking a fabrication method of a semiconductor optical amplifier (quantum dot SOA) wherein quantum dots are used for an active layer as an example.

It is to be noted that, in FIGS. 1(A) to 1(I), the direction perpendicular to the plane of each figure (depthwise direction of each section shown) is the [110] direction, and the thicknesswise direction of each section shown is the [001] direction while the widthwise direction of each section shown is the [1-10] direction.

Referring first to FIG. 1(A), an n-type InP layer (n-InP layer, current block layer, semiconductor layer of the second conduction type) 2 is first grown, for example, to a thickness of 1.0 μm on a p-type (001) InP substrate [p-InP substrate, (001) semiconductor substrate of the first conduction type] 1. Then, a p-type InP layer (p-InP layer, current block layer, semiconductor layer of the first conduction type) 3 is grown, for example, to a thickness of 0.2 μm on the n-type InP layer 2 (semiconductor layer forming step).

By laminating (stacking) the n-InP current block layer 2 and the p-InP current block layer 3 on the p-InP substrate 1 in this manner and laminating an n-InP cladding layer 8B on the layers as hereinafter described, a current constriction (blocking) structure of a pnpn thyristor structure is formed. It is to be noted that, if the operating current can be reduced sufficiently by some other method, then one or a plurality of semiconductor layers which do not function as a current block layer may be formed in place of the current block layers 2 and 3.

In the present embodiment, before a lower side cladding layer is formed, the n-InP current block layer 2 and the p-InP current block layer 3 are formed as described above, and a groove 5 is formed in the current block layers 2 and 3 and a p-InP cladding layer 6 which becomes a lower side cladding layer is formed such that it fills up the groove 5 as hereinafter described.

Then, a mask 4 having, for example, such a mask pattern as a striped opening 4A extending in the [110] direction is formed as seen in FIG. 1(B) (mask forming step, groove forming step). For example, a dielectric mask made of a dielectric material such as $SiO_2$ may be formed. Further, the width (opening width) of the opening 4A may be approximately 1 to 2 μm and is approximately 1.5 μm here. It is to be noted that the width of the opening 4A may be set so as to correspond to a desired active layer width.

Then, etching is performed until the p-InP substrate 1 using etchant such as, for example, HBr as seen in FIG. 1(C) (etching step, groove forming step). By the etching, the n-InP current block layer 2 and the p-InP current block layer 3 at the opening 4A of the mask 4 are removed and a groove 5 having a depth down to the p-InP substrate 1 is formed (groove forming step).

After the groove 5 is formed in this manner, a p-InP cladding layer 6 (p-InP layer) which serves as a p-side cladding layer (lower side cladding layer, first cladding layer, semiconductor layer of the first conduction type) and an active layer 7 are selectively grown using the mask 4 as a selective growth mask as seen in FIGS. 1(D), 1(E) and 1(F) (first cladding layer forming step, active layer forming step).

More particularly, the groove 5 formed at the opening 4A of the mask 4 is gradually filled up with the p-InP cladding layer 6 by selective growth as seen in FIG. 1(D). Then, after the groove 5 is filled up, the p-InP cladding layer 6 grows into a trapezoidal sectional shape [(110) surface] as seen in FIG. 1(E) until it finally has a triangular shape. Consequently, the p-InP cladding layer 6 in the form of a projection is formed on the p-InP substrate 1 (first cladding layer forming step). The p-InP cladding layer 6 formed in this manner has a ridge structure having two symmetrical inclined faces (leftwardly and rightwardly symmetrical; the angles, the lengths of the sides, the areas in the depthwise direction are symmetrical) with the (111) B surfaces thereof exposed. In short, it is only necessary for the p-InP cladding layer 6 to have two symmetrical oblique faces intersecting with each other. It is to be noted that preferably the two inclined faces intersect perpendicularly with each other.

Since the groove 5 is formed in the n-InP current block layer 2 and the p-InP current block layer 3 and the p-InP cladding layer 6 which becomes a lower side cladding layer is formed so as to fill up the groove 5 in this manner, when the p-InP cladding layer 6 which becomes a lower side cladding layer is formed, the current block layers 2 and 3 function as a mold, and the p-InP cladding layer 6 which becomes a lower side cladding layer grows in a triangular shape after the groove 5 is filled up. Therefore, the current block layers 2 and 3 can be provided with good heightwise positions with respect to the active layer 7 formed on the p-InP cladding layer 6 as hereinafter described.

Further, since there is no necessity to take the heightwise positions of the current block layers 2 and 3 with respect to the active layer 7 into consideration, the width of the opening 4A of the mask 4 can be set to a width corresponding to a desired active layer width as described above, and a ridge structure of a width corresponding to the desired active layer width can be formed from the beginning. In other words, since the necessity to form a lower side cladding layer so as to have a triangular sectional shape such that the width thereof may be greater than a desired active layer width taking the heightwise position of a current block layer with respect to the active layer into consideration and perform mesa working (or mesa processing) in this state as in the prior art is eliminated but a ridge structure of a width corresponding to the desired active layer width can be formed from the beginning, a ridge structure having leftwardly and rightwardly symmetrical inclined faces can be implemented and also the yield can be enhanced.

Further, the active layer 7 is formed by growth continuously on the two inclined faces [(111) B surfaces] of the p-InP cladding layer 6 (active layer forming step). Here, the active layer 7 is formed as a 5-cycle multiple layer of an InGaAsP layer (band gap wavelength: 1.1 μm) of 30 nm thick and an InAs dot layer whose supplying amount corresponds to 2 ML. It is to be noted that the configuration of the active layer 7 is not particularly limited to this.

Then, after the active layer 7 is formed, an n-type InP layer (n-InP layer) 8A which forms part of an n-type cladding layer (upper side cladding layer, second cladding layer, semiconductor layer of the second conduction type) is formed by growth continuously.

It is to be noted that the active layer 7 and the n-InP cladding layer 8A do not grow on the mask 4 but grow only on the inclined faces of the p-InP cladding layer 6 having a triangular sectional shape.

Thereafter, the mask 4 is removed, for example, by etching (for example, wet etching) as seen in FIG. 1(G) (mask removing step). Then, an n-type InP layer (n-InP layer) 8B which becomes an n-side cladding layer (upper side cladding layer, second cladding layer, semiconductor layer of the second conduction type) is formed by growth in such a manner that the entire ridge structure formed by lamination (stacking) of the active layer 7 and the n-InP cladding layer 8A on the p-InP cladding layer 6 in the form of a projection is buried as seen in FIG. 1(H) (active layer burying step).

It is to be noted that, if a semiconductor substrate for example, of the n type is used between end faces of the active layer 7 and the n-InP cladding layer 8A and the p-InP current block layer 3, then this provides a structure in which electric current is liable to flow and there is the possibility that a current constriction structure may not be obtained. Therefore, a current constriction structure is implemented here by using a p-type semiconductor substrate as described hereinabove. It is to be noted that, in order to implement a current constriction structure using an n-type semiconductor substrate, such a structure as in the case of a second embodiment hereinafter described may be used.

Then, an n-type InGaAs layer (n-InGaAs layer, contact layer) 9 is formed by growth on the n-InP cladding layer 8B as shown in FIG. 1(H). Finally, electrodes are formed at the top and the bottom as seen in FIG. 1(I). In short, a p-type electrode (p-side electrode, p electrode) 12 is formed on the back face side of the p-InP substrate 1, and an n-type electrode (n-side electrode, n electrode) 11 is formed on the front face side of the n-InGaAs layer 9 (electrode forming step).

The quantum dot SOA (optical semiconductor device) fabricated in such a manner as described above includes, as seen in FIG. 1(I), a p-InP cladding layer 6 in the form of a projection having two symmetrical (leftwardly and rightwardly symmetrical) inclined faces, and an n-InP current block layer 2 and a p-InP current block layer 3 which extend in parallel to the p-InP substrate 1 and are leftwardly and rightwardly symmetrical.

In short, the optical semiconductor device according to the present embodiment fabricated in such a manner as described above is configured in the following manner.

In particular, the present optical semiconductor device (quantum dot SOA) is configured such that it includes, as seen in FIG. 1(I), a p-InP substrate [(001) semiconductor substrate, p-type semiconductor substrate] 1, a p-InP cladding layer (p-side cladding layer) 6 in the form of a projection having two symmetrical (leftwardly and rightwardly symmetrical) inclined surfaces [(111) B surfaces], an active layer 7 formed on the two inclined surfaces of the p-InP cladding layer 6, and a semiconductor layer (here, the n-InP current block layer 2 and the p-InP current block layer 3) formed in a contacting relationship at least with the side faces of the p-InP cladding layer 6 and having an equal thickness at a portion thereof in the proximity of the portion at which it contacts with the p-InP cladding layer 6 and any other portion thereof.

Here, the active layer 7 is formed from quantum dots.

Further, the present optical semiconductor device includes an n-InP current block layer (n-type current block layer) 2 and a p-InP current block layer (p-type current block layer) 3 as the semiconductor layer, and a current constriction structure is formed from the layers 2 and 3 around the active layer 7.

Furthermore, the p-InP cladding layer 6 and the active layer 7 both extend in the [110] direction and form a striped three-dimensional structure.

Accordingly, with the optical semiconductor device and the fabrication method therefor according to the present embodiment, there are advantages that, since the width of the opening 4A of the mask 4 is set to approximately 1.5 μm and the p-InP cladding layer 6 which becomes a lower side cladding layer is selectively grown, the necessity for working (or processing) of a mesa shape (mesa working) is eliminated and that, since the active layer 7 can be formed leftwardly and rightwardly symmetrically, the polarization dependency can be reduced and finally the polarization independent (non-dependency) can be achieved. Also it is possible to adjust the position of the active layer by self-alignment. Particularly where the present invention is applied to a quantum dot SOA, there are advantages that the gain bandwidth can be expanded, that the operating current can be reduced, that the polarization dependency is reduced and that the polarization non-dependency can be implemented and besides that the yield can be enhanced. Furthermore, also it is possible to form a leftwardly and rightwardly symmetrical current constriction structure by self-alignment, and consequently, the polarization non-dependency can be achieved.

It is to be noted that, while the embodiment is described above taking a case wherein the present invention is applied to a quantum dot SOA (semiconductor optical amplifier) as an example, the present invention is not limited to this, but the present invention can be applied widely to optical semiconductor devices wherein an active layer is formed on two symmetrical inclined faces of a cladding layer in the form of a projection.

Further, while the embodiment is described above taking a case wherein the present invention is applied to a quantum dot SOA wherein quantum dots are used for an active layer as an example, the present invention is not limited to this, but the present invention may be applied to optical semiconductor devices wherein, for example, quantum wells or quantum wires are used for an active layer.

Second Embodiment

Now, an optical semiconductor device and a fabrication method therefor according to a second embodiment of the present invention are described with reference to FIGS. 2(A) to 2(G). It is to be noted that, for example, a metal organic vapor phase epitaxy (MOVPE) method is used for the crystal growth.

The optical semiconductor device according to the present embodiment is different from that of the first embodiment described hereinabove in that it uses an n-type semiconductor substrate while the optical semiconductor device of the first embodiment uses a p-type semiconductor substrate. Therefore, also the semiconductor layers use the opposite conduction types to those described hereinabove.

Further, the optical semiconductor device according to the present embodiment is different in that it includes an n-InP semiconductor layer and a semi-insulating semiconductor layer as a current block layer while that of the first embodiment described hereinabove includes the n-InP current block layer 2 and the p-InP current block layer 3 as a current block layer.

It is to be noted that the configuration of the remaining part of the present optical semiconductor device and the fabrication method therefor are basically same as those of the first embodiment described hereinabove, and therefore, the following description is given principally of the differences of the configuration of the optical semiconductor device (quantum dot SOA) and the fabrication method therefor according to the present embodiment. It is to be noted that like elements are denoted by like reference numerals.

It is to be noted that, in FIGS. 2(A) to (2G), the direction perpendicular to the plane of each figure (depthwise direction of each section shown) is the [110] direction, and the thicknesswise direction of each section shown is the [001] direction while the widthwise direction of each section shown is the [1-10] direction.

Referring first to FIG. 2(A), a semi-insulating current block layer (SI-InP layer, current block layer, semi-insulating semiconductor layer) 20 is first grown, for example, to a thickness of 1.0 μm on an n-InP substrate [n-InP substrate, (001) semiconductor substrate of the first conduction type] 10. Then, an n-InP current block layer (n-InP layer, current block layer, semiconductor layer of the first conduction type) 30 is grown, for example, to a thickness of 0.2 μm on the semi-insulating current block layer 20 (semiconductor layer forming step).

By laminating (stacking) the semi-insulating current block layer 20 and the n-InP current block layer 30 on the n-InP substrate 10 in this manner, a current constriction (blocking) structure of a SI-PBH structure is formed. It is to be noted that, if the operating current can be reduced sufficiently by some other method, then one or a plurality of semiconductor layers which do not function as a current block layer may be formed in place of the current block layers 20 and 30.

In the present embodiment, before a lower side cladding layer is formed, the semi-insulating current block layer 20 and the n-InP current block layer 30 are formed as described above, and a groove 5 is formed in the current block layers 20 and 30 and a cladding layer 60 which becomes a lower side cladding layer is formed such that it fills up the groove 5 as hereinafter described.

Then, a mask 4 having such a mask pattern as, for example, a striped opening 4A is formed as seen in FIG. 2(B) (mask forming step, groove forming step).

Then, etching is performed until the n-InP substrate 10 using etchant such as, for example, HBr as seen in FIG. 2(C) (etching step, groove forming step). By the etching, the semi-insulating current block layer 20 and the n-InP current block layer 30 at the opening 4A of the mask 4 are removed and a groove 5 having a depth down to the n-InP substrate 10 is formed (groove forming step).

After the groove 5 is formed in this manner, an n-type cladding layer (n-InP layer) 60 which becomes as an n-side cladding layer (lower side cladding layer, first cladding layer, semiconductor layer of the first conduction type) and an active layer 7 are selectively grown using the mask 4 as a selective growth mask as seen in FIG. 2(D) (first cladding layer forming step, active layer forming step) Since the groove 5 is formed in the semi-insulating current block layer 20 and the n-InP current block layer 30 and the n-InP cladding layer 60 which becomes a lower side cladding layer is formed so as to fill up the groove 5, when the cladding layer 60 which becomes a lower side cladding layer is formed, the current block layers 20 and 30 function as a mold, and the cladding layer 60 which becomes a lower side cladding layer grows in a triangular shape after the groove 5 is filled up. Therefore, the current block layers 20 and 30 can be provided at good heightwise positions with respect to the active layer 7 formed on the n-InP cladding layer 60 as hereinafter described.

Further, since there is no necessity to take the heightwise positions of the current block layers 20 and 30 with respect to the active layer 7 into consideration, the width of the opening 4A of the mask 4 can be set to a width corresponding to a desired active layer width as described above, and a ridge structure of a width corresponding to the desired active layer width can be formed from the beginning. In other words, since the necessity to form a lower side cladding layer so as to have a triangular sectional shape such that the width thereof may be greater than a desired active layer width taking the heightwise position of a current block layer with respect to the active layer into consideration and perform mesa working (mesa processing) in this state as in the prior art is eliminated but a ridge structure of a width corresponding to the desired active layer width can be formed from the beginning, a ridge structure having leftwardly and rightwardly symmetrical inclined faces can be implemented and also the yield can be enhanced.

Further, an active layer 7 is formed by growth continuously on the two inclined faces [(111) B surfaces] of the n-InP cladding layer 60 (active layer forming step) Then, after the active layer 7 is formed, an p-InP cladding layer (p-InP layer) 80A which forms part of a p-side cladding layer (upper side cladding layer, second cladding layer, semiconductor layer of the second conduction type) is formed by growth continuously.

It is to be noted that the active layer 7 and the p-InP cladding layer 80A do not grow on the mask 4 but grow only on the inclined faces of the cladding layer 60 having a triangular sectional shape.

Thereafter, the mask 4 is removed, for example, by etching (for example, wet etching) as seen in FIG. 2(E) (mask removing step). Then, a p-InP cladding layer (p-InP layer) BOB which forms the p-side cladding layer (upper side cladding layer, second cladding layer, semiconductor layer of the second conduction type) is formed by growth in such a manner that the entire ridge structure formed by lamination (stacking) of the active layer 7 and the p-InP cladding layer 80A on the n-InP cladding layer 60 in the form of a projection is buried as seen in FIG. 2(F) (active layer burying step).

It is to be noted that, if a semiconductor substrate for example, of the n type is used between end faces of the active layer 7 and the p-InP cladding layer 80A and the n-InP current block layer 30, then this provides a structure in which electric current is liable to flow and there is the possibility that a current construction structure may not be obtained. Therefore, a current constriction structure is implemented here by using the semi-insulating current block layer 20 and the n-InP layer as a current block layer as described hereinabove.

Then, a p-type InGaAs layer (p-InGaAs layer, contact layer) 90 is formed by growth on the p-InP cladding layer 80B as shown in FIG. 2(F). Finally, electrodes are formed at the top and the bottom as seen in FIG. 2(G). In short, an n-type electrode (n-side electrode, n electrode) 100 is formed on the back face side of the n-InP substrate 10, and a p-type electrode (p-side electrode, p electrode) 110 is formed on the front face side of the p-InGaAs layer 90 (electrode forming step).

The quantum dot SOA (optical semiconductor device) fabricated in such a manner as described above includes, as seen in FIG. 2(G), an n-InP cladding layer 60 in the form of a projection having two symmetrical (leftwardly and rightwardly symmetrical) inclined faces, and a semi-insulating current block layer 20 and an n-InP current block layer 30 which extend in parallel to the n-InP substrate 10 and are leftwardly and rightwardly symmetrical.

In short, the optical semiconductor device according to the present embodiment fabricated in such a manner as described above is configured in the following manner.

In particular, the present optical semiconductor device (quantum dot SOA) is configured such that it includes, as seen in FIG. 2(G), an n-InP substrate [(001) semiconductor substrate, n-type semiconductor substrate] 10, an n-InP cladding layer (n-side cladding layer) 60 in the form of a projection having two symmetrical (leftwardly and rightwardly symmetrical) inclined surfaces [(111) B surfaces], an active layer 7 formed on the two inclined surfaces of the n-InP cladding layer 60 and a semiconductor layer (here, the semi-insulating current block layer 20 and the n-InP current block layer 30) formed in a contacting relationship at least with the side faces of the n-InP cladding layer 60 and having an equal thickness at a portion thereof in the proximity of the portion at which it contacts with the cladding layer 60 and any other portion thereof.

Further, the present optical semiconductor device includes a semi-insulating current block layer 20 and an n-InP current block layer (n-type current block layer) 30 as the semiconductor layer, and a current constriction (blocking) structure is formed from the layers 20 and 30

What is claimed is:

1. A fabrication method for an optical semiconductor device, comprising:

forming a current block layer on a semiconductor substrate;

forming a groove by removing the current block layer at an opening of a mask;

forming a first cladding layer including a projection having two symmetrical inclined faces in the groove by selective growth by using the mask as a selective growth mask so that the projection is positioned above the current block layer;

forming an active layer on the two inclined faces of the first cladding layer so that the current block layer is positioned on the opposite sides of the active layer; and removing the mask and burying the active layer with a second cladding layer.

2. The fabrication method for an optical semiconductor device as claimed in claim 1, wherein, at the current block layer forming step, a plurality of current block layers having different conduction types are formed.

3. The fabrication method for an optical semiconductor device as claimed in claim 1, wherein, at the groove forming step, a dielectric mask having a striped opening extending in the [110] direction is formed as the mask.

4. The fabrication method for an optical semiconductor device as claimed in claim 1, wherein, at the groove forming step, a mask having an opening of a width corresponding to a desired active layer width is formed as the mask.

5. The fabrication method for an optical semiconductor device as claimed in claim 1, wherein, at the active layer forming step, an active layer formed from one of quantum dots, quantum wires and quantum wells is formed as the active layer.

6. The fabrication method for an optical semiconductor device as claimed in claim 1, wherein:

at the current block layer forming step, the current block layer is formed on a (001) semiconductor substrate;

at the first cladding layer forming step, the first cladding layer having two (111) B surfaces on the (001) semiconductor substrate; and at the active layer forming step, the active layer is formed on the two (111) B surfaces of the first cladding layer.

7. The fabrication method for an optical semiconductor device as claimed in claim 1, wherein:

at the current block layer forming step, a semi-insulating current block layer and an n-type current block layer are formed in order on an n-type semiconductor substrate;

at the groove forming step, a dielectric mask is formed as the mask, and the semi-insulating current block layer and the n-type current block layer at the opening are etched to form the groove;

at the first cladding layer forming step, an n-side cladding layer is formed as the first cladding layer in the groove;

at the active layer forming step, an active layer is formed on the two inclined faces of the n-side cladding layer; and at the active layer burying step, the dielectric mask is removed and the active layer is buried with a p-side cladding layer as the second cladding layer.

8. The fabrication method for an optical semiconductor device as claimed in claim 1, wherein, at the current block layer forming step, an n-type current block layer and a p-type current block layer are formed in order on a p-type semiconductor substrate;

at the groove forming step, a dielectric mask is formed as the mask, and the n-type current block layer and the p-type current block layer at the opening are etched to form the groove;

at the first cladding layer forming step, a p-side cladding layer is formed as the first cladding layer in the groove;

at the active layer forming step, an active layer is formed on the two inclined faces of the p-side cladding layer; and at the active layer burying step, the dielectric mask is removed and the active layer is buried with an n-side cladding layer as the second cladding layer.

9. The fabrication method for an optical semiconductor device as claimed in claim 1, further comprising, after all of the steps, the conditional step of forming electrodes at the top and the bottom.

10. An optical semiconductor device, comprising:
a semiconductor substrate;
a cladding layer formed on said semiconductor substrate and including a projection having two symmetrical inclined faces;
an active layer formed only on the two inclined faces of said cladding layer; and
a current block layer formed in a contacting relationship with side faces being below the two inclined faces of said cladding layer and having an equal thickness at portions in the proximity of contacting portions thereof with said cladding layer and any other portion thereof than the portions;
wherein said projection is positioned above said current block layer and said current block layer is positioned on the opposite sides of said active layer.

11. The optical semiconductor device as claimed in claim 10, wherein said active layer is formed from one of quantum dots, quantum wires and quantum wells is formed as the active layer.

12. The optical semiconductor device as claimed in claim 10, wherein said current block layer is comprised of a plurality of current block layers having different conduction types in which a current constriction structure can be formed.

13. The optical semiconductor device as claimed in claim 10, wherein said cladding layer is formed on a (001) semiconductor substrate and each of said inclined faces thereof is formed as a (111) B surface, and said active layer is formed on the two (111) B surfaces of said cladding layer.

14. The optical semiconductor device as claimed in claim 10, wherein said cladding layer and said active layer extend in a [110] direction.

15. The optical semiconductor device as claimed in claim 10, wherein said semiconductor substrate is an n-type semiconductor substrate while said cladding layer is an n-side cladding layer, and said current block layer is comprised of a semi-insulating current block layer and an n-type current block layer.

16. The optical semiconductor device as claimed in claim 10, wherein said semiconductor substrate is a p-type semiconductor substrate while said cladding-layer is a p-side cladding layer, and said current block layer is comprised of an n-type current block layer and a p-type current block layer.

* * * * *

UNITED STATES PATENT AND TRADEMARK OFFICE
CERTIFICATE OF CORRECTION

PATENT NO. : 7,598,106 B2  Page 1 of 1
APPLICATION NO. : 11/111995
DATED : October 6, 2009
INVENTOR(S) : Tomabechi et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 459 days.

Signed and Sealed this

Twenty-eighth Day of September, 2010

David J. Kappos
*Director of the United States Patent and Trademark Office*